(12) United States Patent
Emirian et al.

(10) Patent No.: US 11,194,943 B2
(45) Date of Patent: Dec. 7, 2021

(54) FPGA-BASED HARDWARE EMULATOR SYSTEM WITH AN INTER-FPGA CONNECTION SWITCH

(71) Applicant: Synopsys, Inc., Mountain View, CA (US)

(72) Inventors: Frédéric Emirian, Antony (FR); Francois Douëzy, Paris (FR)

(73) Assignee: Synopsys, Inc., Mountain View, CA (US)

( * ) Notice: Subject to any disclaimer, the term of this patent is extended or adjusted under 35 U.S.C. 154(b) by 382 days.

(21) Appl. No.: 16/214,914

(22) Filed: Dec. 10, 2018

(65) Prior Publication Data
US 2019/0179989 A1 Jun. 13, 2019

(30) Foreign Application Priority Data
Dec. 12, 2017 (EP) .................................... 17206799

(51) Int. Cl.
*G06F 30/331* (2020.01)
(52) U.S. Cl.
CPC .................................. *G06F 30/331* (2020.01)
(58) Field of Classification Search
CPC .................................................... G06F 30/331
USPC ......................................................... 703/14
See application file for complete search history.

(56) References Cited

U.S. PATENT DOCUMENTS

| | | | | |
|---|---|---|---|---|
| 5,329,470 A * | 7/1994 | Sample | .................. | G06F 11/261 703/28 |
| 5,937,179 A * | 8/1999 | Swoboda | .............. | G06F 11/261 716/103 |
| 6,651,225 B1 * | 11/2003 | Lin | ........................ | G06F 30/331 716/113 |
| 6,785,873 B1 * | 8/2004 | Tseng | ...................... | G06F 30/33 716/102 |
| 6,934,674 B1 * | 8/2005 | Douezy | .................. | H03K 5/135 703/19 |
| 7,830,172 B1 * | 11/2010 | Baxter | ................ | G06F 15/7867 326/41 |
| 7,904,288 B1 * | 3/2011 | Beausoleil | .............. | G06F 30/33 703/23 |
| 7,965,801 B1 * | 6/2011 | O'Reilly | ............... | H04L 7/0338 375/355 |
| 9,325,489 B2 * | 4/2016 | Hsieh | .................... | H04L 7/0334 |

(Continued)

OTHER PUBLICATIONS

Dreschmann et al. ("A Framework for Multi-FPGA Interconnection using Multi Gigabit Transceivers", ACM, 2015, pp. 1-6) (Year: 2015).*
Altera Corporation ("Integrating 100-GbE Switching Solutions on 28-nm FPGAs", 2010, pp. 1-9),) (Year: 2010).*

(Continued)

*Primary Examiner* — Iftekhar A Khan
(74) *Attorney, Agent, or Firm* — Fenwick & West LLP

(57) ABSTRACT

A hardware emulation system for emulating an integrated circuit design under test (DUT) includes a switch system, FPGAs and serial transmitter and receiver circuitry. The switch system has input and output ports and is configurable to change which ports are connected to each other. The FPGAs are configurable to emulate a functionality of the DUT. The functionality of the DUT is partitioned across multiple FPGAs. The serial transmitter circuitry transmits data from the FPGAs on serial lines to the ports of the switch system. The serial receiver circuitry receives data for the FPGAs on serial lines from the ports of the switch system.

19 Claims, 6 Drawing Sheets

(56) References Cited

U.S. PATENT DOCUMENTS

| | | | |
|---|---|---|---|
| 9,449,138 B2* | 9/2016 | Chang | G06F 30/398 |
| 10,162,007 B2* | 12/2018 | Chan | G01R 31/31907 |
| 10,796,048 B1* | 10/2020 | Azuelos | G06F 30/331 |
| 2002/0152060 A1* | 10/2002 | Tseng | G06F 30/331 |
| | | | 703/17 |
| 2004/0111252 A1* | 6/2004 | Burgun | G01R 31/318357 |
| | | | 703/28 |
| 2004/0236556 A1* | 11/2004 | Lin | G06F 30/33 |
| | | | 703/14 |
| 2005/0267730 A1* | 12/2005 | Kfir | G06F 30/331 |
| | | | 703/26 |
| 2010/0153053 A1* | 6/2010 | Bose | G06F 11/26 |
| | | | 702/119 |
| 2011/0040920 A1* | 2/2011 | Chou | G06F 13/28 |
| | | | 710/316 |
| 2011/0041105 A1* | 2/2011 | Chou | G06F 13/28 |
| | | | 716/106 |
| 2011/0307239 A1* | 12/2011 | Portillo | G06F 30/331 |
| | | | 703/28 |
| 2014/0070846 A1* | 3/2014 | Zou | G01R 31/31924 |
| | | | 326/82 |
| 2015/0040096 A1* | 2/2015 | Chang | G06F 30/331 |
| | | | 716/136 |
| 2015/0135147 A1* | 5/2015 | Emirian | G06F 30/398 |
| | | | 716/105 |
| 2016/0049940 A1* | 2/2016 | Jain | H03K 19/17736 |
| | | | 326/38 |
| 2016/0371407 A1* | 12/2016 | Larzul | G06F 30/20 |
| 2017/0091360 A1* | 3/2017 | Adaikalasamy | G06F 30/331 |
| 2017/0109466 A1* | 4/2017 | Guerin | G06F 30/331 |
| 2017/0255727 A1* | 9/2017 | Liu | G06F 16/27 |
| 2017/0255728 A1* | 9/2017 | Wakefield | G06F 30/331 |
| 2017/0357743 A1* | 12/2017 | Larzul | G06F 30/331 |
| 2017/0364621 A1* | 12/2017 | Lepercq | G06F 30/392 |
| 2018/0082004 A1* | 3/2018 | Liu | G06F 30/331 |
| 2018/0121573 A1* | 5/2018 | Chou | G06F 30/331 |
| 2018/0150582 A1* | 5/2018 | Lepereq | G06F 30/392 |
| 2018/0225394 A1* | 8/2018 | Verma | G06F 30/33 |

OTHER PUBLICATIONS

Farooq et al. ("Comparison of Direct and Switch-based Inter-FPGA Routing Interconnect for Multi-FPGA Systems", IEEE, 2017, pp. 1-6) (Year: 2017).*

Melo et al. (An inter-FPGA communication bus with error detection and dynamic clock phase adjustment,2015, Journal of the Brazilian Computer Society, pp. 1-11) (Year: 2015).*

Asmeen Kashif (Experimental Evaluation and Comparison of Time-Multiplexed Multi-FPGA Routing Architectures, 2017, University of Windsor, pp. 1-140) (Year: 2017).*

* cited by examiner

FPGA-BASED HARDWARE EMULATOR SYSTEM WITH AN INTER-FPGA CONNECTION SWITCH

CROSS-REFERENCE TO RELATED APPLICATION(S)

This application claims priority to European Application Serial No. EP17206799.3, "Efficient Inter-Board Connection-Switch for an Emulator and its Subsequent Software Support Flow," filed Dec. 12, 2017. The subject matter of all of the foregoing is incorporated herein by reference in their entirety.

BACKGROUND

1. Technical Field

This disclosure relates generally to hardware emulation of circuit designs.

2. Description of Related Art

Hardware emulation of very large circuit designs, often for functional verification of the circuit—such as server CPUs, GPUs, a large System-On-Chip, or systems comprising multiple integrated circuits—often require hardware emulators comprising several hundred, to several thousand, Field Programmable Gate Arrays (FPGAs).

Typically, the required data communications bandwidth between these multiple FPGAs can be very high, too high to be handled by ordinary I/O connections on the FPGAs. One alternative to ordinary I/O in recent years has been to use Multi-Gigabit Transceivers (MGTs), which can transmit and receive a serial signal at bit rates above 1 Gbit/s. One of the first commercially available MGTs was Virtex's "RocketIO", which could operate up to 3.125 Gbit/s.

In "A Framework for multi-FPGA interconnection using Multi-Gigabit Transceivers" (by M. Dreschmann et al, ACM SBCCI Conference, 2015), each FPGA board contains two network-on-chip routers and six MGTs, allowing only direct MGT connections between neighboring FPGAs. The routers are used to transmit data between more distant FPGAs, but via intermediate FPGAs rather than through a direct connection.

However, such hardware emulation systems can be very expensive (in the millions of dollars), so that it is useful to allow a hardware emulation system to be shared by several users simultaneously. This is difficult to do with existing systems.

SUMMARY

In some of the embodiment disclosed herein, an architecture for hardware emulators is disclosed which is scalable in term of capacity. In a current implementation, it can be structured to produce a hardware emulator ranging in size from 12 FPGAs (i.e., 12 FPGAs on 1 module-board) up to 768 FPGAs (64 module-boards). In this implementation, the inter-board connections are based on Multi-Gigabit Transceivers (MGTs). The module boards are interconnected through a programmable cross-point switch. This switch supports partial programming: the establishment of a new connection between two ports without interfering with any previously existing connection (running or transferring data).

This architecture allows the emulation resources to be shared among multiple users in parallel, each using a subset of the FPGAs or module-boards. The subset may be chosen by the user at runtime, according to availability. The inter-board connections are realized by a partial programming of the switch.

The use of a switch, compared to direct FPGA-to-FPGA connection as in other architectures, prevents losing inter-board connections when some FPGAs are not being used by the current emulation. The use of a switch also allows adapting the topology of the inter-board connections so as to optimize the matching to the requirement for the routing of the emulated design. It also tends to improve the runtime performance. Certain switches can also be used to connect one emitter FPGA/board to several receiver FPGA/boards.

Other aspects include components, devices, systems, improvements, methods, processes, applications, computer readable mediums, and other technologies related to any of the above.

This overview does not attempt to provide the complete significance of any particular innovation, embodiment, or example as it can be used in commerce. Additionally, this overview is not intended to signify key or critical elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this overview is as a prelude to a Detailed Description presented later.

BRIEF DESCRIPTION OF THE DRAWINGS

The following Detailed Description, Figures, and Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

In the various figures, reference signs may be omitted as is consistent with accepted engineering practice. However, one of ordinary skill in the art will understand that the illustrated components are readily understood when viewed in context of the illustration as a whole and the accompanying disclosure describing such various figures.

Figure 1:
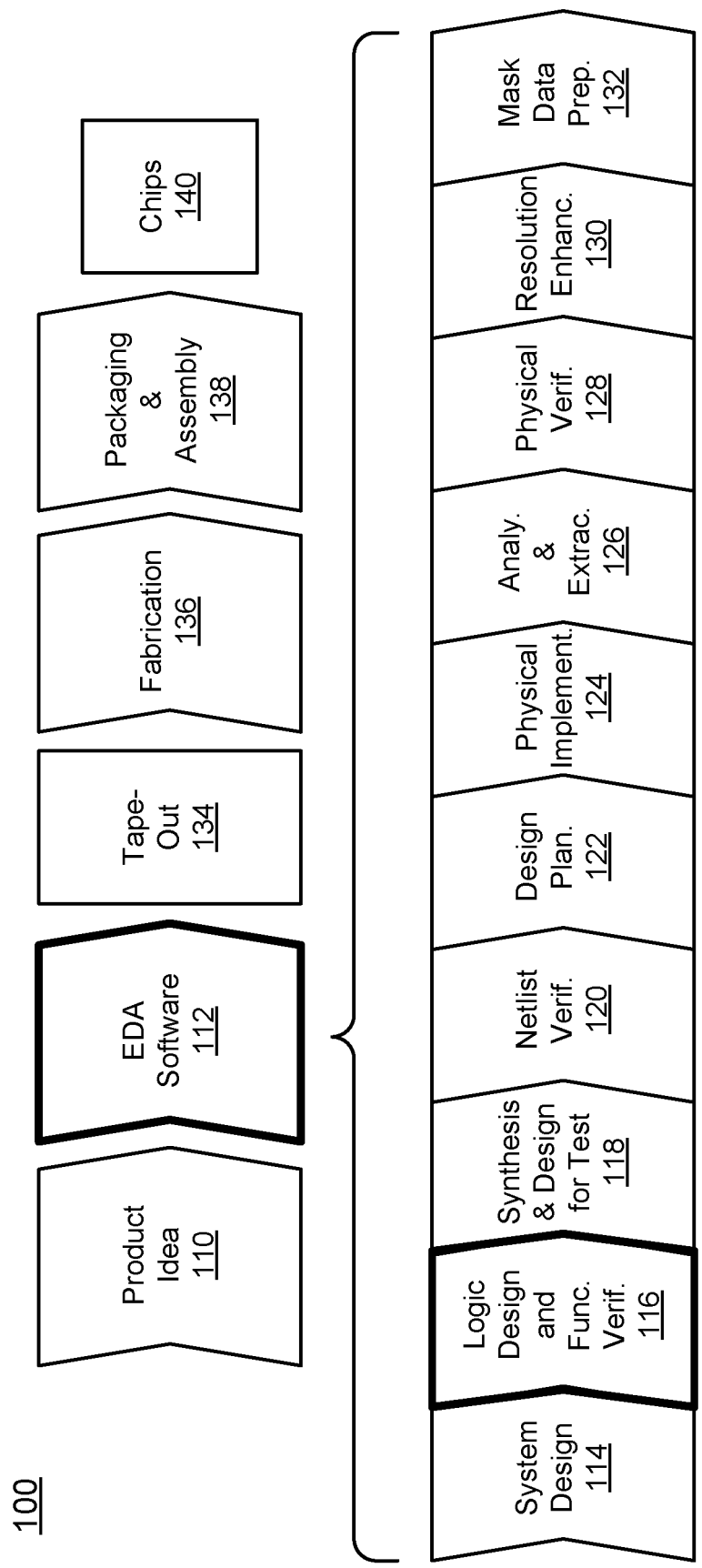

FIG. 1 is a flowchart illustrating various operations in the design and fabrication of an integrated circuit in accordance with an embodiment of the present disclosure.

Figure 2:
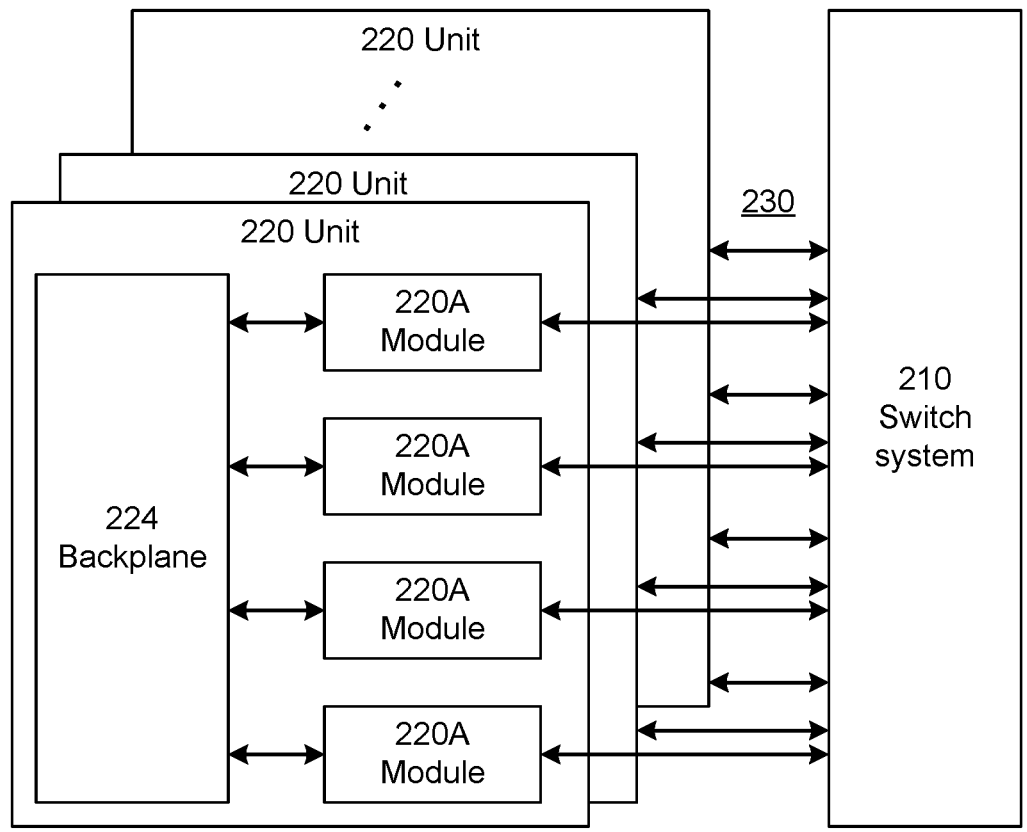

FIG. 2 is an example of a scalable architecture for a hardware emulator system interconnecting multiple FPGAs.

Figure 3:
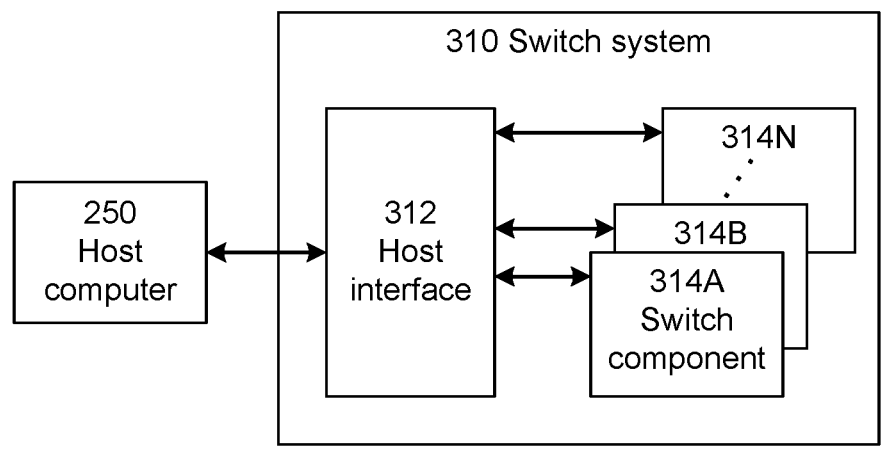

FIG. 3 depicts a detailed architecture for a switch system.

Figure 4:
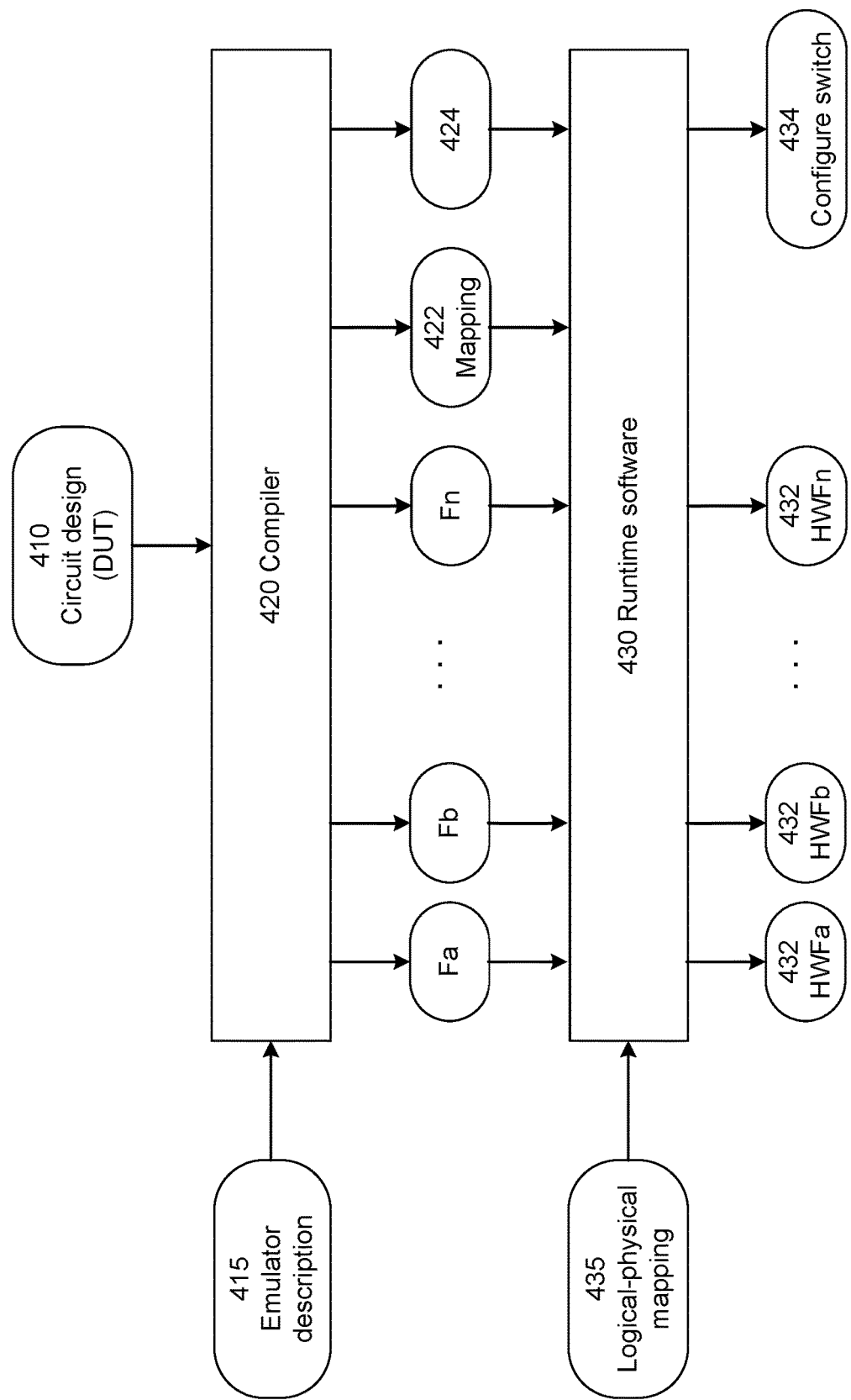

FIG. 4 depicts a software flow for configuring the FPGAs and the switch system.

Figure 5:
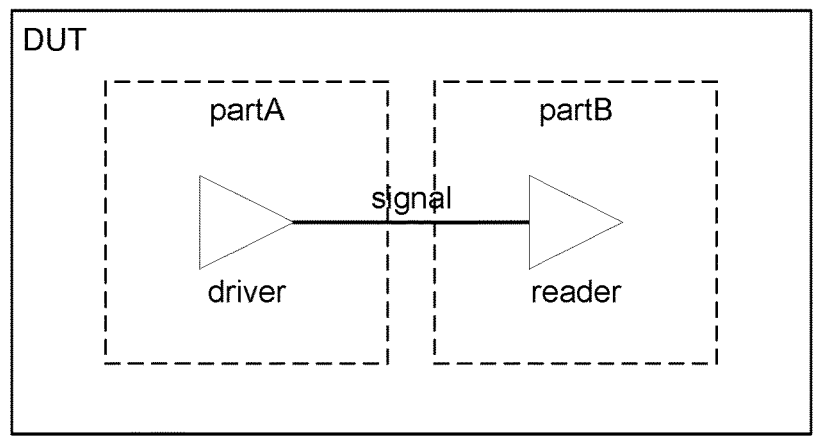

FIG. 5 depicts an example of a partitioning of an integrated circuit Design under Test (DUT).

Figure 6A:
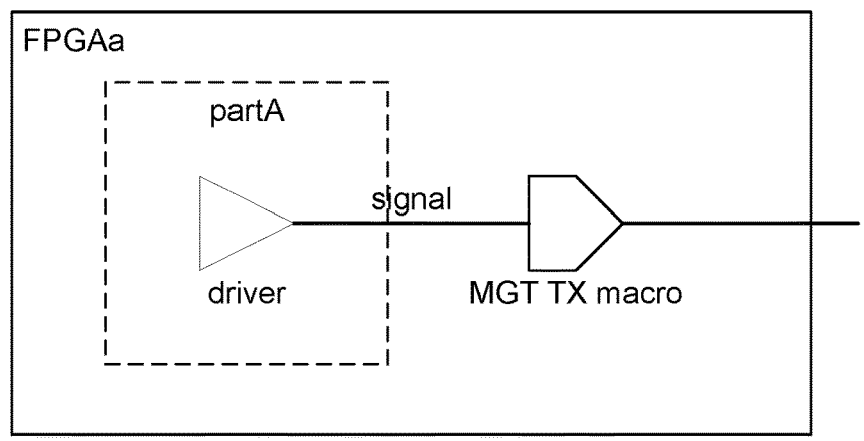
Figure 6B:
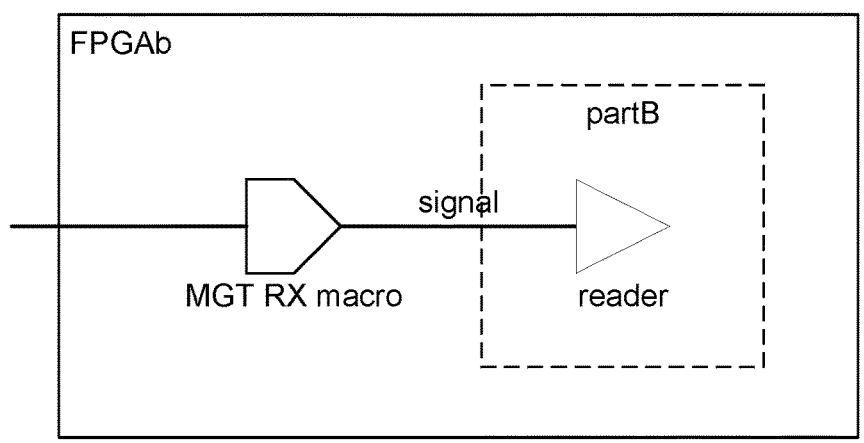

FIGS. 6A and 6B depict the insertion of serial transmitter and receiver macros into the FPGA partitions.

Figure 7A:
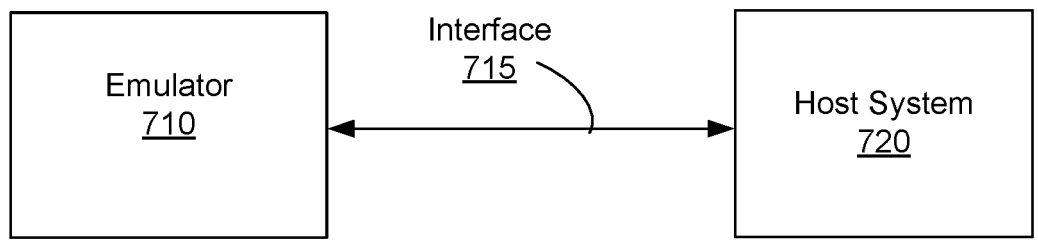

FIG. 7A is a block diagram of a hardware emulation system.

Figure 7B:
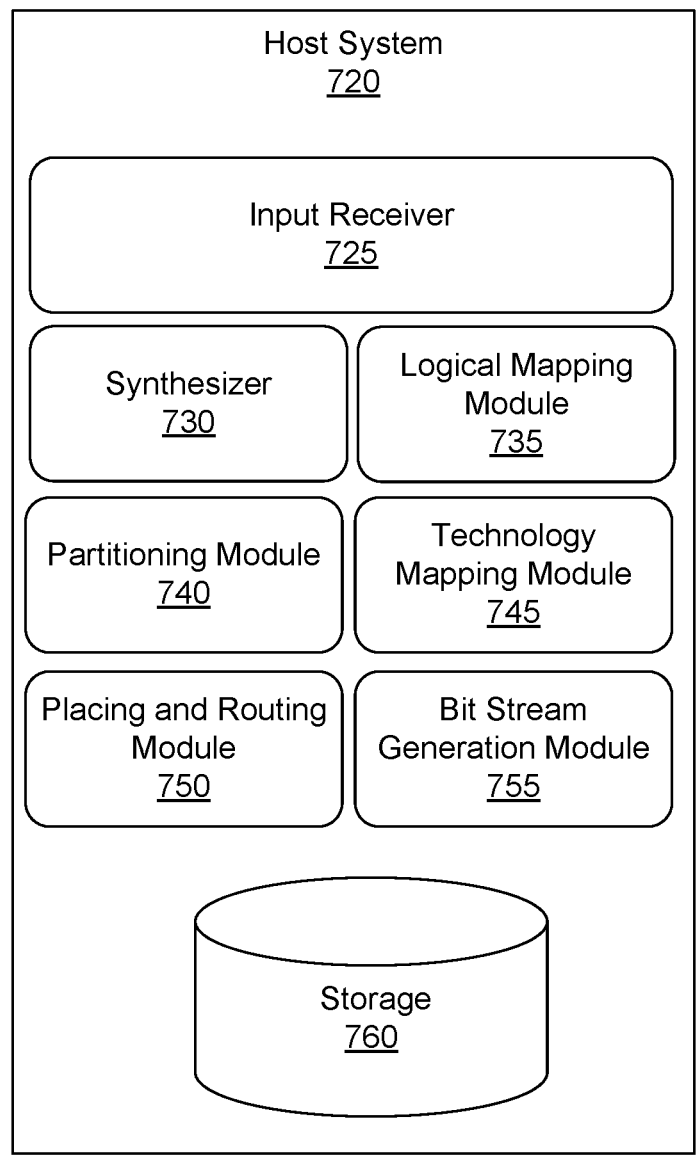

FIG. 7B is a block diagram illustrating a host system.

Figure 8:
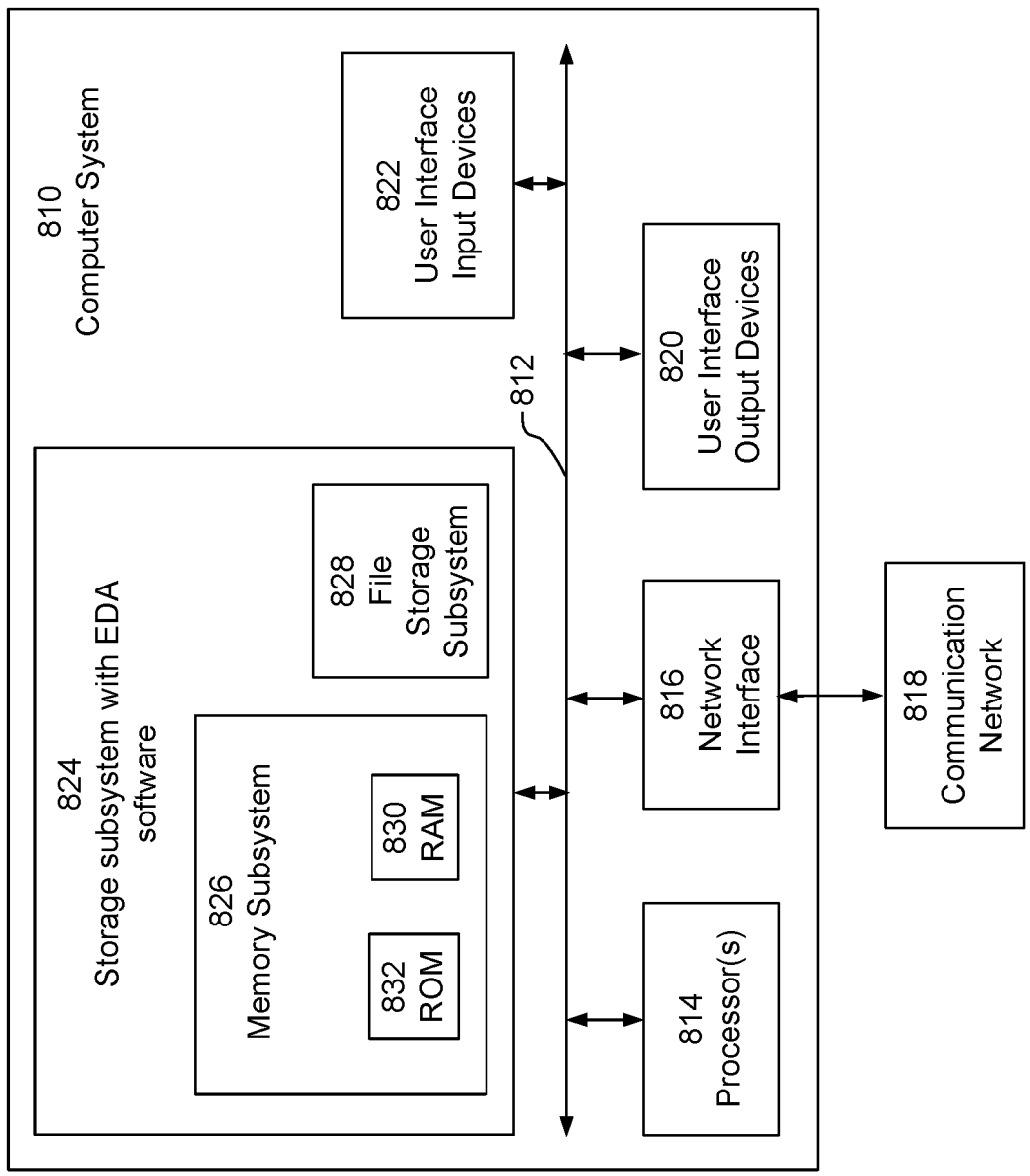

FIG. 8 is a simplified block diagram of a computer system suitable for use with embodiments of the technology, as well as circuit design and circuit embodiments of the technology.

DETAILED DESCRIPTION OF THE PREFERRED EMBODIMENTS

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to provide a thorough understanding of one or more of the exemplary innovations, embodiments and/or examples. In the interest of not obscuring the presentation of the exemplary innovations, embodiments and/or examples in the following Detailed Description, some processing steps or operations that are known in the art may have been combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. The following description is instead focused on the distinctive features or elements of various exemplary innovations, embodiments and/or examples. Furthermore, while this description may refer to some components of the structure in the singular tense, more than one component may be depicted throughout the Figures and like components are labeled with like numerals.

FIG. 1 illustrates various processes performed in the design, verification and fabrication of an item of manufacture such as an integrated circuit using software tools with a computer, and possibly special hardware-assisted tools, to transform and verify design data and instructions that represent the integrated circuit. These processes start with the generation of a product idea (110) with information supplied by a designer, information which is transformed during a process to create an item of manufacture (referred to herein as a design or device) that uses EDA software tools (112), which may also be signified herein as EDA software, as a design tool or a verification tool. When the design is finalized, it can be taped-out (134), which typically is when artwork for the integrated circuit is sent to a fabrication facility. After tape-out, a semiconductor die is fabricated (136) and packaging and assembly processes (138) are performed, which result in the finished integrated circuit (140) which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at a high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses EDA software tools (112) includes tasks 114-132, which are described below. This design flow description is for illustration purposes only and is not meant to limit the present disclosure. For example, an actual integrated circuit design may require a designer to perform the design operations in a different sequence than the sequence described herein.

During system design (114), a designer describes the functionality to be manufactured. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products.

During logic design and functional verification (116), modules in the circuit are specified in one or more hardware description languages, or HDLs, and the design in HDL is checked for functional accuracy. More specifically, the design is checked to ensure that it produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as "emulators" or "prototyping systems" are used to speed up the functional verification. Exemplary EDA software products from Synopsys, Inc. of Mountain View, Calif. that can be used at this stage include: VCS, Vera, Designware, Magellan, Formality, ESP and Leda products. Exemplary hardware emulator and prototyping products also available from Synopsys that can be used at this state include: Zebu and Protolink.

During synthesis and design for test (118), VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include:

Design Compiler, Physical Compiler, Test Compiler, Power Compiler, FPGA Compiler, Tetramax, and Designware products.

During netlist verification (120), the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products.

During design planning (122), an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation (124), the placement (positioning of circuit elements such as transistors or capacitors) and routing (connection of the same by a plurality of conductors) occurs. Exemplary EDA software products from Synopsys, Inc. of Mountain View, Calif. that can be used at this stage include: the Astro and IC Compiler products.

During analysis and extraction (126), the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification (128), the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement (130), geometric manipulations of the layout are performed to improve manufacturability of the design. Exemplary EDA software products from Synopsys, Inc. of Mountain View, Calif. that can be used at this stage include: Proteus products.

During mask-data preparation (132), the "tape-out" data for production of masks to produce finished integrated circuits is provided. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in hardware emulators (116).

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

FIG. 2 is an example of a scalable architecture for a hardware emulator system interconnecting multiple FPGAs. The hardware emulation system includes a switch system 210 with input and output ports. The switch system is configurable to change which ports are connected to each other. The hardware emulation system also includes FPGAs that will be configured to emulate the functionality of the Design under Test (DUT). The functionality of the DUT is partitioned across multiple FPGAs. The FPGAs are connected to the ports on the switch system 210 by serial lines 230. Transmitter circuitry transmits data from the FPGAs on the serial lines 230 to the ports of the switch system 210 without a separate transmission of a clock signal for the data. Receiver circuitry receives data for the FPGAs on the serial lines 230 from the ports of the switch system 210. The serial receiver circuitry includes clock and data recovery circuitry.

In the example implementation of FIG. 2, the scalable hardware architecture is made with identical module-boards 222A-D, which contain the design FPGAs (for example, 22 FPGAs in each module-board 222 in this example). In this implementation, up to four module-boards 222 are interconnected through a backplane 224 to constitute a "unit" 220.

Each module-board 222 has connectors for cable connection to a switch. In this example, there are 8 connectors per module-board to connect 8 cables 230. That is, each FPGA is connected to one serial line 230 to transmit data and another serial line 230 to receive data. This level of granularity allows any FPGA to be connected to any other FPGA. Other implementations may be more or less granular. For example, connections to switch ports may be made at the module-board or unit level, rather than for individual FPGAs. The connections are Multi-Gigabit-Transceivers (MGT), which is a form of SerDes (serializer/deserializer), running at up to 10 Gbit/s in the current embodiment. This implementation is based on the MGT transmitter (TX) and receiver (RX) pin-pairs available on the Xilinx FPGAs that are contained in each module. For example, see "Ultrascale Architecture GTH Transceivers User Guide—UG576" from Xilinx. In one embodiment, the cables 230 are copper wire-based, using the QSFP format (Quad Small Form-factor Pluggable). In another embodiment, the cables 230 are optical cables, with embedded light transceivers at both ends (to convert electrical signals into light signals, and to convert light signals back to electrical signals).

The speed of the MGTs allows to multiplex data from the emulation of different DUTs on one single MGT serial line, as well as to multiplex different signals from the same DUT on a single MGT serial line. In the description below, when the mapping of emulation data for one DUT is described for convenience, it should be interpreted as one among many DUT signals multiplexed on the same MGT line. Typically, in the current implementation, the minimum multiplexing rate is 64: that is from 1 to 64 DUT signals can be multiplexed on the same MGT serial line without any significant impact on the performance of the hardware emulator.

The number of units 220 connected to the switch 210 is adapted to the customer's needs (scalable architecture), for example ranging from 1 to 16 in the current embodiment.

FIG. 3 depicts a detailed architecture for a switch system 310. The switch system has a host-interface 312, for the programming of the switch function at runtime from the computer-host 350 controlling the hardware emulator. It has some switching components 314A-N (at least one) which implement the switch function. A switch component 314 has a number of input ports (128 in this implementation) and a number of output ports (also 128 in this implementation). It is configurable connect any one of the input ports to an output port, or to leave an output port unassigned when not used or not connected.

In this example, the switch component 314 is able to assign a new input port to a new output port without any impact on the already assigned input-output connections. This allows the hardware emulation system to support multiple users. A new user can configure the switch system 310 when he or she connects to the hardware emulator, while other already-connected users continue their on-going emulations without interruption.

In some embodiments, the switch component 314 is an analog asynchronous crosspoint. Typical examples of such components are provided by MACOM. This choice allows to minimize the latency for the signal to go across the component (from 2 to 5 ns in a current implementation). In some embodiments, the crosspoint comprises 160×160 interconnections.

FIG. 4 depicts a software flow for configuring the FPGAs and the switch system. A compiler 420 reads the description of the Design under Test (DUT) 410. It also reads a description 415 of the available hardware emulator resources, which may be a logical description of the available FPGAs. The compiler 420 partitions the DUT into many partitions partA-partN. There may be potentially several hundred partitions. The compiler 420 also generates a mapping 422 of partitions onto logical FPGAs Fa-Fn. The compiler generates the corresponding bitstream files (i.e., configuration files) to configure each corresponding FPGA Fa-Fn.

In some cases, two partitions may have a common DUT signal. In FIG. 5, partA is the driver of signal and partB is the reader of signal. If these two partitions are mapped onto FPGAs which can only be connected through the switch system (e.g., and not via a backplane), the compiler 420 also inserts a MGT transmitter macro in FPGA Fa (located on MGT pin-pair MGTa) as shown in FIG. 6A, and a MGT receiver macro in FPGA Fb (located on MGT pin-pair MGTb) as shown in FIG. 6B. In a current implementation, the MGT TX and RX macros are based on Xilinx cells described in the "Ultrascale Architecture GTH Transceivers User Guide" from Xilinx. Additionally, the compiler 420 generates a "switch-cross-reference file" 424 which indicates that the switch port connected to MGTa shall be assigned to the switch port for MGTb at runtime by programming the switch system. File 424 is a configuration file for the switch system. Below is an example of a line from that file.

FPGAb.MGTb=FPGAa.MGTa

This means that FPGA b, MGT b is connected to receive data from FPGA a, MGT a.

The software flow also comprises a runtime software which is executed on a computer host 350. The computer host 350 reads a mapping 435 of the "logical" FPGAs onto the physical FPGAs. It reads the bitstream files of the FPGAs Fa-Fn and downloads 432 them into the FPGA of the hardware emulator according to the chosen mapping. It reads the switch-cross-reference-file 424 and programs 434 the switch system.

When launching the runtime, the user specifies a mapping 435 of the logical FPGAs produced by the compiler on physical FPGAs in the hardware. In this implementation, this is done per module. The user specifies that a logical module is mapped on a physical module, thus the logical FPGAs in the logical module are mapped on the corresponding FPGAs in the physical module.

In this implementation, when choosing a mapping 435, the user also ensures that both driver and reader physical FPGAs are connectable through the switch system. In some hardware implementations, the connection of the same MGT pin-pair of one specific FPGA on each module to one specific switch component ensures that any specified mapping will fulfill the requirement.

The runtime software combines these mapping instructions 435 with the content of the switch-cross-reference file 424 to the physical locations of the MGT pin-pairs to be connected through the switch system. It then combines these physical locations with the hardware description 415 to get the switch component identifier and the input and output port number for an assignment. An example hardware description for the switch system is shown below:

M0.Fa.MGT_TX_0:switchComp0.INw
M0.Fa.MGT_RX_0:switchComp0.OUTx
. . .
Mm.Fb.MGT_TX_0:switchComp0.INy
Mm.Fb.MGT_RX_0:switchComp0.OUTz
. . .
Mn.Fa.MGT_TX_0:switchComp1.INw
Mn.Fa.MGT_RX_0:switchComp1.OUTx In this example, M0.Fa.MGT_TX_0:switchComp0.INw means that module 0, FPGA Fa, MGT transmitter 0 is connected to switch component 0, input port w; M0.Fa.MGT_RX_0:switchComp0.OUTx means that module 0, FPGA Fa, MGT receiver 0 is connected to switch component 0, output port x, and so on. Note that the logical FPGA descriptions in the switch-cross-reference file 424 are replaced by physical FPGA addresses. The runtime software programs the corresponding switch component to connect the corresponding input port to the corresponding output port.

An additional function of the switch system is to broadcast one input to several outputs (the current hardware implementation allows the broadcast on any subset or all of the outputs of the switch component). The corresponding lines in the switch-cross-reference file might look like:

FPGAb.MGTb=FPGAa.MGTa
FPGAc.MGTc=FPGAa.MGTa

This means that FPGA b, MGT b is connected to receive data from FPGA a, MGT a; and FPGA c, MGT c is also connected to receive data from FPGA a, MGT a.

The compiler can take advantage of this feature to efficiently broadcast a signal of the DUT mapped on the emulator from its driver partition (for instance in the FPGAa) to many reader partitions mapped on many distant hardware modules connected through the switch, while using one single MGT transmitter on FPGAa. This will improve the performance by saving some other MGT transmitters on the emitter FPGAa to route other signals of the DUT to other distant locations, and by avoiding intermediate hops (an intermediate partition which receives the signal and re-emits it to other partitions).

FIG. 7A is a block diagram illustrating a hardware emulation system, according to one embodiment. The emulation environment includes an emulator 710 and a host system 720. The emulator 710 and the host system 720 communicate through an interface 715.

The interface 715 is a communication medium that allows communication between the host system 720 and the emulator 710. In one embodiment, the interface 715 is a cable with electrical connections. For example, the interface 715 may be an USB, ETHERNET, optical, or a custom built cable. In other embodiment, the interface 715 is a wireless communication medium or a network. For another example, the interface 715 may be a wireless communication medium employing a Bluetooth® or IEEE 802.11 protocol.

The emulator 710 is a hardware system that emulates DUTs. The emulator 710 includes FPGAs that can be configured to collectively emulate a DUT. In other embodiments, the emulator 710 includes other types of reconfigurable hardware components instead of FPGAs. For a DUT that is to be emulated, the emulator 710 receives from the host system 720 a bit stream (e.g., one or more binary files) including a description of a DUT (e.g., a gate level or HDL description of the DUT) and a description of debugging logic. Additionally, the bit stream describes partitions of the DUT created by the host system 720, mappings of the partitions to emulator FPGAs, placement of logic (DUT logic and debugging logic) on FPGAs, and routings between placed logic. Based on the bit stream, the emulator 710 configures the appropriate FPGAs and emulates the DUT.

The host system 720 configures the emulator 710 for emulating a DUT with debugging logic. A DUT is one or more circuit designs that are to be emulated by the emulator 710. The host system 720 may be a single computer or a collection of multiple computers. In the embodiment where the host system 720 is comprised of multiple computers, the functions described herein as being performed by the host system 720 may be distributed among the multiple computers.

The host system 720 receives from a user a description of a DUT to be implemented on the emulator 710. In one embodiment, the description of the DUT is in a type of hardware description language (HDL), such as register transfer language (RTL). The host system 720 creates a gate level netlist based on the HDL description of the DUT. In another embodiment, the description of the DUT received from the user is in a gate level netlist. The host system 720 uses the netlist to determine placement and routing of DUT logic components on the FPGAs of the emulator 710.

The host system 720 also receives from a description of debugging logic to be implemented on the emulator 710 with the DUT. In one embodiment, the host system 720 receives from a user a list of signals to be observed or a type of debugging logic to be implemented, and the host system 720 creates debugging logic according to the user input. In one embodiment, the host system 720 receives from a user a description of the debugging logic in a gate level netlist or in a type of HDL (e.g., RTL) from which a gate level netlist is created. The host system 720 may receive the description of the debugging logic together with the DUT. In one embodiment, the host system 720 adds the debugging logic at predetermined locations regardless of the DUT. The host system 720 determines the placement and routing of the debugging logic on the emulator FPGAs in a manner that the routings between DUT logic components and the debugging logic can be optimized.

The host system 720 generates one or more bit streams (configuration files) which includes information to configure the emulator FPGAs to emulate the DUT with the debugging logic. A bit stream may include, for example, a design description of one or more partitions of the DUT (e.g., gate level or HDL description), mapping information (e.g., mappings of partitions to FPGAs), placement and routing information, and design constraints for the DUT.

Through interface 715, the host system 720 transmits to the emulator 710 the created bit streams to configure the FPGAs to emulate the DUT. During and/or after the emulator 710 emulates the DUT, the host system 720 receives emulation results from the emulator 710. Emulation results are information generated by the emulator 710 based on the emulation of the DUT.

FIG. 7B is a block diagram illustrating the host system 720 in more detail, according to one embodiment. The host system 720 includes an input receiver 725, synthesizer 730, logical mapping module 735, partitioning module 740, technology mapping module 745, placing and routing module 750, bit stream generation module 755, and storage 760. Each of these components may be embodied as hardware, software, firmware, or a combination thereof. Together these components generate information to configure the emulator 710 to emulate a DUT. Some of these components correspond to the components shown in FIG. 4.

The input receiver 725 receives descriptions of a DUT and debugging logic to be implemented by the emulator 710. In one embodiment, the input receiver 725 receives the descriptions of the DUT and the debugging logic in HDL description or in a gate level netlist. The description of the DUT and the description of the debugging logic may be received in a same format or in different formats. Additionally, the input receiver 725 enables a user to provide information indicating which outputs of DUT logic components (i.e., signals) to trace during emulation using the debugging logic.

The synthesizer 730 converts HDL descriptions into gate level logic. If a description of the DUT and/or debugging logic is received in HDL, the synthesizer 730 synthesizes the HDL description to create a gate-level netlist with a description of the DUT and/or debugging logic in terms of gate level logic. In one embodiment, the synthesizer 730 may also convert a received gate level netlist (e.g., for the DUT or the debugging logic) into another gate-level netlist.

The logical mapping module 735 maps logic of the DUT and the debugging logic to components available in the FPGAs of the emulator 710. For the DUT and the debugging logic, the logical mapping module 735 identifies logic included in the gate level netlist that is not available in the emulator FPGAs and associates (assigns) a corresponding hardware component that is available in an emulator FPGA. For example, the logical mapping module 735 identifies a Boolean logic gate in the gate level netlist and associates the Boolean logic gate with a corresponding logic gate or a look up table (LUT) unit available in an FPGA. In one embodiment, the logical mapping module 735 modifies the gate level netlist based on the mapping.

The partitioning module 740 partitions the DUT and maps the partitions to emulator FPGAs. The partitioning module 740 partitions the DUT at the gate level into a number of partitions using the DUT's netlist. The partitioning module 740 maps each partition to one or more FPGAs of the emulator 710. The partitioning module 740 performs the partitioning and mapping using design rules, design constraints (e.g., timing or logic constraints), and information about the emulator 710.

The technology mapping module 745 maps physical components of the DUT based on the logical mapping and partitioning. Specifically, if necessary, the technology mapping module 745 modifies one or more partitions based on the partitions created and the mappings of the partitions to the FPGAs. For example, assume the DUT includes three logic gates where an output of a first logic gate is connected to an input of a second logic gate and an input of a third logic gate. The DUT may be partitioned such that the first logic gate and the second logic gate are to be implemented on the same FPGA, but the third logic gate is to be implemented on a different FPGA. A connection between the first logic gate and the third logic gate in different FPGAs may have an additional delay compared to a connection between two logic gates in the same FPGA, thereby causing incorrect operations. The technology mapping module 745 may add delay elements (or buffers) between the two logic gates on the same FPGA to match the delay between the logic gates on different FPGAs.

The placing and routing module 750 receives the gate level netlist and information about the partitioning and mapping, and determines placement and connections of each DUT logic component and debugging logic. The placing and routing module 750 places the logic components and the debugging logic in a manner that routings between the logic components and the debugging logic are optimized.

The host system 720 may be a computing system. Additional examples of computing systems that may be configured as the host system 720 are described below and with FIG. 8.

FIG. 8 is a simplified block diagram of a computer system suitable for use with embodiments of the technology, as well as circuit design and circuit embodiments of the technology.

Computer system 810 typically includes at least one computer or processor 814 which communicates with a number of peripheral devices via bus subsystem 812. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms "processor" and "computer" are further defined below. These peripheral devices may include a storage subsystem 824, comprising a memory subsystem 826 and a file storage subsystem 828, user interface input devices 822, user interface output devices 820, and a network interface subsystem 816. The input and output devices allow user interaction with computer system 810.

The computer system may be a server computer, a client computer, a workstation, a mainframe, a personal computer (PC), a tablet PC, a set-top box (STB), a personal digital assistant (PDA), a cellular telephone, a smartphone, a web appliance, a kiosk, a television, a game station, a network router, switch or bridge, or any data processing machine capable of executing instructions (sequential or otherwise) that specify actions to be taken by that machine. The computer system typically includes an operating system, such as Microsoft's Windows, Apple Computer's Mac OS, Linux or Unix.

Innovations, embodiments and/or examples of the claimed inventions are neither limited to conventional computer applications nor the programmable apparatus that run them. For example, the innovations, embodiments and/or examples of the claimed inventions can include an optical computer, quantum computer, analog computer, or the like. The computer system may be a multi-processor or multi-core system and may use or be implemented in a distributed or remote system. The term "processor" here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 810 depicted in FIG. 8 is intended only as one example for purposes of illustrating the preferred embodiments. Many other configurations of computer system 810 are possible having more or less components than the computer system depicted in FIG. 8.

Network interface subsystem 816 provides an interface to outside networks, including an interface to communication network 818, and is coupled via communication network 818 to corresponding interface devices in other computer systems or machines. Communication network 818 may comprise many interconnected computer systems, machines and communication links. These communication links may be wireline links, optical links, wireless links, or any other devices for communication of information. Communication network 818 can be any suitable computer network, for example a wide area network such as the Internet, and/or a local area network such as Ethernet. The communication network can be wired and/or wireless, and the communication network can use encryption and decryption methods, such as is available with a virtual private network.

User interface input devices 822 may include an alphanumeric keyboard, pointing devices such as a mouse, trackball, touchpad, stylus, or graphics tablet, a scanner, a touchscreen incorporated into the display, audio input devices such as voice recognition systems, microphones, and other types of input devices. In general, use of the term "input device" is intended to include all possible types of devices and ways to input information into computer system 810 or onto communication network 818.

User interface output devices 820 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 810 to the user or to another machine or computer system.

Memory subsystem 826 typically includes a number of memories including a main random-access memory (RAM) 830 (or other volatile storage device) for storage of instructions and data during program execution and a read only memory (ROM) 832 in which fixed instructions are stored. File storage subsystem 828 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 828.

Bus subsystem 812 provides a device for letting the various components and subsystems of computer system 810 communicate with each other as intended. Although bus subsystem 812 is shown schematically as a single bus, alternative embodiments of the bus subsystem may use multiple busses. For example, RAM-based main memory can communicate directly with file storage systems using Direct Memory Access (DMA) systems.

A memory such as a non-transitory, computer readable data and information storage medium may be associated with file storage subsystem 828, and/or with network interface subsystem 816, and can include a data structure specifying a circuit design. The memory can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

Some of the innovations, embodiments and/or examples described herein comprise and/or use a processor. As used herein, the term "processor" signifies a tangible data and information processing device that physically transforms data and information, typically using a sequence transformations (also referred to as "operations"). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a "cloud computing" environment or as a "software as a service" (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term "module" signifies a tangible data and information processing device, that typically is limited in size and/or complexity. For example, the term "module" can signify one or more methods or procedures that can transform data and information. The term "module" can also signify a combination of one or more methods and procedures in a computer program. The term "module" can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence transformations (also referred to as "operations") applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term "algorithm" signifies a sequence or set of operations or instructions that a module can use to transform data and information to achieve a result. A module can comprise one or more algorithms.

As used herein, the term "computer" includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term "software" or "program" signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term "programming language" signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network.

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein were chosen and described to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed is:

1. A hardware emulation system for emulating an integrated circuit design under test (DUT), the hardware emulation system comprising:
   a switch system having a plurality of ports, the switch system configurable to change which ports are connected to each other;
   a plurality of FPGAs configurable to emulate a functionality of the DUT, wherein the functionality of the DUT is partitioned across multiple FPGAs;
   serial transmitter circuitry that transmits data from the FPGAs on serial lines to the ports of the switch system without a separate transmission of a clock signal for the data;
   serial receiver circuitry that receives data for the FPGAs on serial lines from the ports of the switch system, the serial receiver circuitry including clock and data recovery circuitry; and
   a compiler that partitions the functionality of the DUT across multiple FPGAs, generates an FPGA configuration file for each of the FPGAs to implement the DUT functionality mapped to that FPGA, and generates a switch configuration file that specifies which ports are connected to each other based on the mapping of the DUT functionality to the FPGAs.

2. The hardware emulation system of claim 1 wherein the serial transmitter circuitry and the serial receiver circuitry are capable of communicating data over the serial lines at a data rate of at least 10 Gb/s per serial line.

3. The hardware emulation system of claim 2 wherein the serial transmitter circuitry and the serial receiver circuitry are implemented as Multi-Gigabit Transceivers.

4. The hardware emulation system of claim 1 wherein the serial transmitter circuitry and the serial receiver circuitry are implemented on the FPGAs.

5. The hardware emulation system of claim 1 wherein the switch system is configurable to change connections between some of the ports without affecting an on-going emulation that uses connections between other ports.

6. The hardware emulation system of claim 1 wherein the hardware emulation system is extendible by adding more FPGAs and connecting the added FPGAs to the switch system, without affecting an on-going emulation implemented on other FPGAs.

7. The hardware emulation system of claim 6 wherein the hardware emulation system is extendible to at least 500 FPGAs.

8. The hardware emulation system of claim 1 wherein the hardware emulation system is configurable to emulate multiple DUTs simultaneously.

9. The hardware emulation system of claim 8 wherein emulation data for at least two of the DUTs are multiplexed onto a same serial line.

10. The hardware emulation system of claim 8 wherein the hardware emulation system is configurable for emulation of an additional DUT without affecting on-going emulation of other DUTs.

11. The hardware emulation system of claim 1 wherein the switch system is configurable to broadcast data from one port to two or more other ports.

12. The hardware emulation system of claim 1 wherein the switch system comprises an analog asynchronous crosspoint.

13. The hardware emulation system of claim 1 wherein the switch system comprises a plurality of switch components, each switch component having a plurality of ports and configurable to change which ports are connected to each other.

14. The hardware emulation system of claim 1 wherein the FPGAs are connected to the ports of the switch system in a configuration that allows the switch system to connect individual FPGAs to each other.

15. The hardware emulation system of claim 1 wherein the FPGAs are implemented on modules, each module containing multiple FPGAs, and the modules are connected to the ports of the switch system in a configuration that allows the switch system to connect individual modules to each other.

16. The hardware emulation system of claim 15 wherein the modules are implemented as units, each unit comprising multiple modules and a backplane for communication between the modules in that unit.

17. The hardware emulation system of claim 15 wherein the modules are implemented as units, each unit comprising multiple modules, and the FPGAs on different units can communicate with each other only via the switch system.

18. The hardware emulation system of claim 1 wherein the hardware emulation system is capable of an emulation speed of at least 6 MHz.

19. The hardware emulation system of claim 1 wherein, for FPGAs that communicate with each other via the switch system, the compiler also includes macros for serial transmitter circuitry and/or serial receiver circuitry in the FPGA configuration file for those FPGAs.

* * * * *